(12) United States Patent
Liwinski

(10) Patent No.: US 7,890,065 B1
(45) Date of Patent: Feb. 15, 2011

(54) TEMPERATURE COMPENSATED POWER DETECTOR

(75) Inventor: Henry Liwinski, North Wales, PA (US)

(73) Assignee: Anadigics, Inc., Warren, NJ (US)

( * ) Notice: Subject to any disclaimer, the term of this patent is extended or adjusted under 35 U.S.C. 154(b) by 1118 days.

(21) Appl. No.: 11/515,260

(22) Filed: Sep. 1, 2006

(51) Int. Cl.
*H03C 1/62* (2006.01)

(52) U.S. Cl. .................................. 455/115.1

(58) Field of Classification Search ............ 455/91, 455/115.1
See application file for complete search history.

(56) References Cited

U.S. PATENT DOCUMENTS

| | | | |
|---|---|---|---|
| 4,375,614 A * | 3/1983 | Steiner | 323/280 |
| 5,956,627 A * | 9/1999 | Goos | 455/127.1 |
| 6,108,527 A | 8/2000 | Urban et al. | |
| 6,559,722 B1 * | 5/2003 | Lopez et al. | 330/296 |
| 2002/0025788 A1 * | 2/2002 | Nitta | 455/115 |

* cited by examiner

*Primary Examiner*—Matthew D Anderson
*Assistant Examiner*—David Bilodeau
(74) *Attorney, Agent, or Firm*—William L. Botjer

(57) ABSTRACT

A temperature-compensated power detector for detecting variations in the power level of an RF signal. The temperature-compensated power detector includes a detector circuit and a temperature compensating circuit. The detector circuit detects the power level of an RF signal and provides an output voltage that corresponds to the power level of the RF signal. The temperature compensating circuit ensures that the output voltage of the temperature-compensated power detector is independent of changes in the temperature.

13 Claims, 3 Drawing Sheets

TEMPERATURE COMPENSATED POWER DETECTOR

RELATED APPLICATIONS

This application is related to the following application which is hereby incorporated by reference as if set forth in full in this specification: co-pending U.S. patent application Ser. No. 11/329,449, entitled "Compact Voltage Regulator", filed on Jan. 11, 2006.

BACKGROUND OF THE INVENTION

The present invention relates to power detectors. More specifically, it relates to a temperature-compensated power detector, which may be integrated into wireless communication devices. Examples of wireless communication devices include portable radio sets, mobile phones, Personal Digital Assistants (PDAs), wireless data-processing units, and the like.

For example, in a portable radio set, the output power level may vary with frequency, temperature and power supply. It may also vary from one portable radio set to another. The variations in the output power level may affect the performance of the portable radio set, or may disturb other radio sets operating in its proximity. Another example is a transmitter of a cellular base station employing the Global System for Mobile communication (GSM) standards, where variations exist in the output power level corresponding to different time slots. These variations have to be controlled.

Accordingly, a power detector is incorporated to detect the output power level of an RF signal, and control the variations in the output power level of the RF signal. The power detector detects the output power level of the RF signal and provides a voltage, which corresponds to that output power level. The voltage from the power detector is then used to control the output power level of the RF signal.

Generally, a power detector is designed with one or more diodes. A voltage across the junction of a diode is temperature-dependent. Consequently, the output voltage of the power detector is also temperature-dependent. This may limit the application of power detectors in electronic circuits, especially if variations in the output power level, as compared to the temperature, need to be tracked. Therefore, the output voltage of a power detector is made independent of the temperature by a process known as temperature compensation. A power detector with temperature compensation is referred to as a temperature-compensated power detector.

Various methods exist to temperature-compensate a power detector. In one such method, a balance (differential) amplifier is used. The output of a biased power detector diode is applied to one input of the balance (differential) amplifier, and the voltage from an identical DC-biased diode is applied to another input of the balance (differential) amplifier. If both the diodes have the same temperature dependence, the differential output voltage of the balance (differential) amplifier will be temperature-independent.

Another method utilizes a variable resistor arrangement, which is connected to the power detector as a load resistance. The load resistance is changed, either manually or automatically, along with the temperature, to temperature-compensate the power detector.

However, one or more of the methods to temperature-compensate a power detector needs elaborate circuitry, requiring space and power, to provide sufficient temperature compensation.

In light of the foregoing discussion, there is a need for a compact, low power-consuming temperature-compensated power detector. Moreover, the temperature-compensated power detector should have a good dynamic range and temperature stability.

SUMMARY OF THE INVENTION

An object of the present invention is to provide a temperature-compensated power detector to detect variations in the power level of a Radio Frequency (RF) signal.

Another object of the present invention is to provide a temperature-compensated power detector with a relatively good dynamic range.

Another object of the present invention is to provide a compact temperature-compensated power detector.

Yet another object of the present invention is to provide a temperature-compensated power detector with low power consumption.

In accordance with the objects of the invention, various embodiments of the invention provide a temperature-compensated power detector, which includes a detector circuit and a temperature compensating circuit. The detector circuit detects the power level of an input RF signal, and provides an output voltage that corresponds to its power level. The temperature compensating circuit includes a temperature-dependent power supply, which is used to forward bias the detector circuit. In various embodiments of the invention, the temperature-dependent power supply may be a voltage regulator. The temperature compensating circuit may also include a resistive divider circuit, one or more diodes, and a capacitor. The various components of the temperature compensating circuit may be selected so that its temperature co-efficient is equal to that of the detector circuit. The temperature compensating circuit ensures that the output voltage of the detector circuit does not change with the temperature, thereby temperature-compensating the power detector.

BRIEF DESCRIPTION OF THE DRAWINGS

So that the manner in which the above recited features of the present invention can be understood in detail, a more particular description of the invention, briefly summarized above, may be had by reference to various embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DESCRIPTION OF PREFERRED EMBODIMENTS

Various embodiments of the invention provide a temperature-compensated power detector for a Radio Frequency (RF) application. The temperature-compensated power detector includes a detector circuit and a temperature compensating circuit. The detector circuit detects the power level of an input RF signal and provides an output voltage that corresponds to the power level. The temperature compensating circuit ensures that the output voltage provided by the detector circuit is independent of changes in temperature, thereby temperature-compensating the detector circuit.

Figure 1:
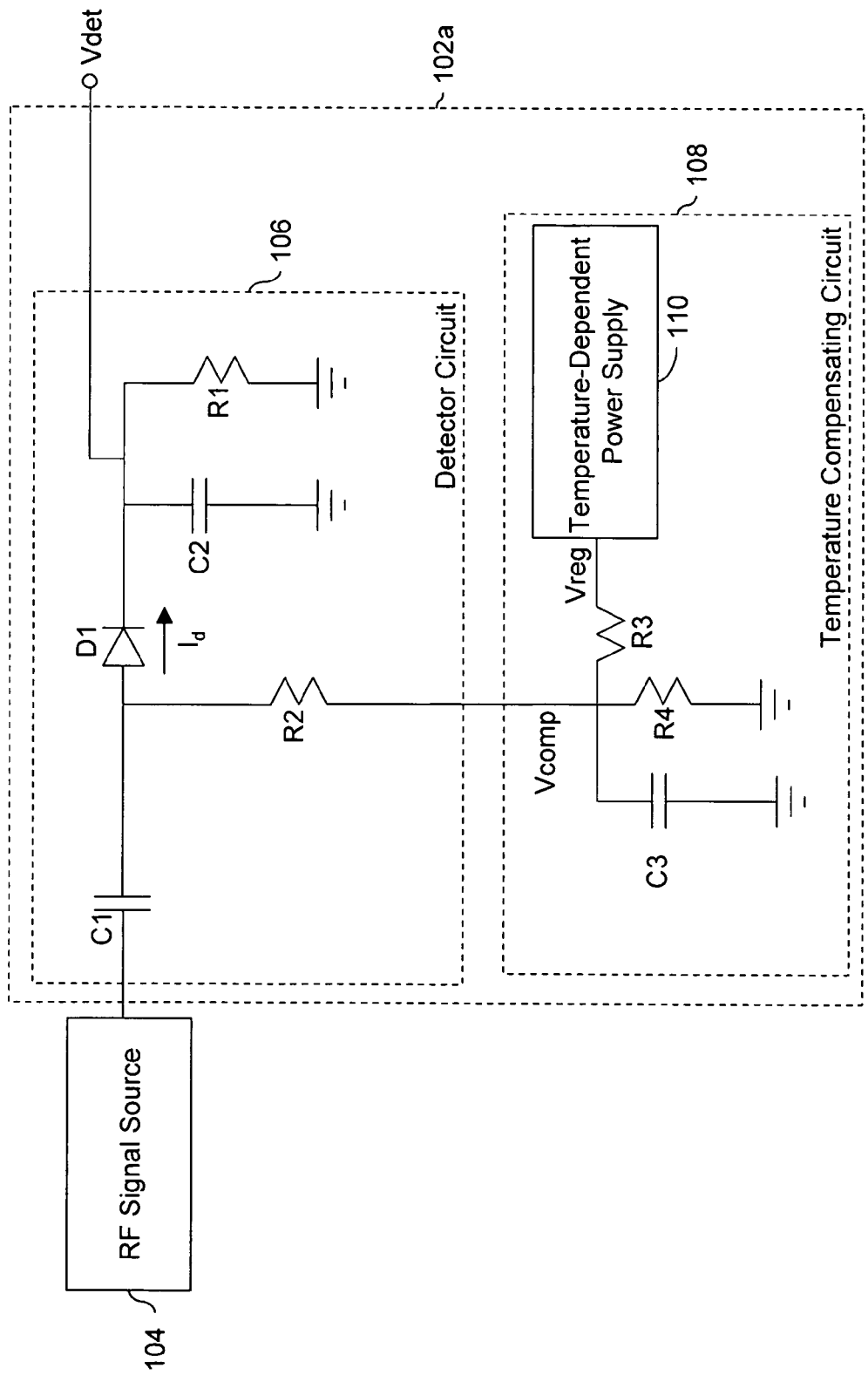
FIG. 1 is a schematic representation of a circuit diagram of a temperature-compensated power detector, in accordance with an embodiment of the invention.

FIG. 1 is a schematic representation of a circuit diagram of a temperature-compensated power detector 102a, in accordance with an embodiment of the invention. Temperature-compensated power detector 102a is hereinafter referred to as power detector 102a. FIG. 1 includes a power detector 102a and an RF signal source 104. Power detector 102a includes a detector circuit 106 and a temperature compensating circuit 108. Detector circuit 106 includes capacitors C1 and C2, a diode D1, and resistors R1 and R2. Temperature compensating circuit 108 includes a temperature-dependent power supply 110, a resistive divider comprising resistors R3 and R4, and a capacitor C3. Detector circuit 106 provides an output voltage, $V_{det}$, which corresponds to the power level of RF signal source 104. Temperature compensating circuit 108 provides a voltage $V_{comp}$ to detector circuit 106. The temperature co-efficient of temperature compensating circuit 108 is equal to that of detector circuit 106. As a result, variations in $V_{det}$ due to changes in temperature are cancelled by variations in $V_{comp}$, and power detector 102a is temperature compensated.

RF signal source 104 is connected to the anode of diode D1 through capacitor C1. The cathode of diode D1 is connected to capacitor C2 and resistor R1. The other ends of capacitor C2 and resistor R1 are grounded. One end of resistor R2 is connected to the anode of diode D1, and the other end is connected to resistor R3, resistor R4, and capacitor C3. The other ends of capacitor C3 and resistor R4 are grounded. Resistor R3 is connected to the common node of capacitor C3, resistor R2, resistor R4, and temperature-dependent power supply 110.

Temperature-dependent power supply 110 provides a regulated voltage, $V_{reg}$, which is temperature-dependent. The resistive divider comprising resistors R3 and R4 divides $V_{reg}$ in a pre-defined ratio, to provide a biasing and compensating voltage, $V_{comp}$, to diode D1 through resistor R2. Consequently, a current, $I_d$, is passed through diode D1 and resistor R1. RF signal source 104 provides an input signal to power detector 102a. Capacitor C1 isolates RF signal source 104 from the DC voltage of detector circuit 106. The output voltage of power detector 102a, $V_{det}$, consists of a DC bias component and another DC component that is a result of signal detection. The impedance of RF signal source 104, resistor R2, capacitor C2 and resistor R1 determine the charging and discharging rate of power detector 102a. A bypass capacitor C3 provides a path to the ground for the input signal.

In various embodiments of the invention, temperature-dependent power supply 110, resistor R3, and resistor R4 are selected so that diode D1 is forward biased, and the resultant temperature co-efficient of temperature compensating circuit 108 is equal to the temperature co-efficient of detector circuit 106. As a result, the effect of temperature changes on diode D1 is cancelled by that of temperature changes on $V_{comp}$. Consequently, $I_d$ remains constant and the output voltage $V_{det}$ of power detector 102a is independent of temperature.

In various embodiments of the invention, temperature compensating circuit 108 may include one or more temperature-dependent power supplies. Diode D1 may be made with different technologies and may be replaced with a combination of one or more diodes. For example, diode D1 may be a diode-connected Bipolar Junction Transistor (BJT). Capacitor C2 and resistor R1 may be replaced with various combinations of capacitors and resistors, in order to determine the discharging rate of power detector 102a. The resistive divider comprising resistors R3 and R4 may include more than two resistors connected together in various configurations.

In various embodiments of the invention, the temperature co-efficient of $V_{comp}$ is matched with the resultant temperature co-efficient of one or more diodes of detector circuit 106. The one or more diodes of detector circuit 106 are hereinafter referred to as one or more detector diodes. If the resultant temperature co-efficient of the one or more detector diodes is less than that of $V_{reg}$, a resistive divider may be used in temperature compensating circuit 108, connected between temperature-dependent power supply 110, ground, and detector circuit 106. In various embodiments of the invention, the resistive divider is chosen such that $V_{comp}$ remains high enough to bias the one or more detector diodes. In various embodiments of the invention, temperature compensating circuit 108 may include different temperature-dependent components such as resistors, diodes, and the like.

The ability to adjust the DC component of $V_{det}$, resulting from the biasing of the detector, depends on voltage available from temperature-dependent power supply 110, the size of the one or more power detector diodes, the value of resistor R1, and the temperature co-efficients of detector circuit 106 and $V_{reg}$.

In various embodiments of the invention, $V_{det}$ may be connected to an RF power control circuit, a monitoring circuit, and the like. $V_{det}$ may be used to control the variations in power level of an input RF signal source.

Figure 2:
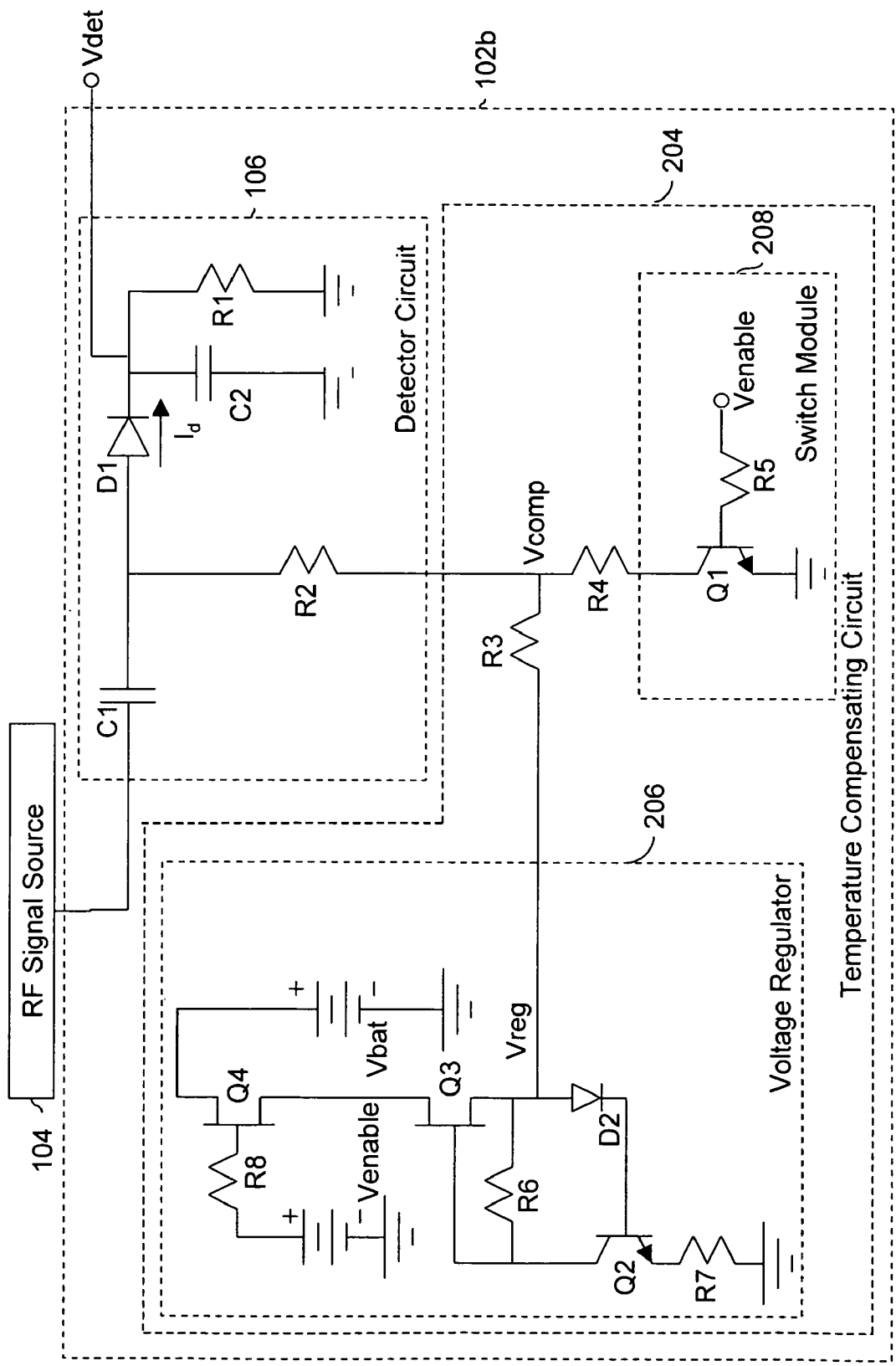
FIG. 2 is a schematic representation of a circuit diagram of a temperature-compensated power detector, in accordance with an exemplary embodiment of the invention.

FIG. 2 is a schematic representation of a circuit diagram of a temperature-compensated power detector 102b, in accordance with an exemplary embodiment of the invention. Power detector 102b includes detector circuit 106, a temperature compensating circuit 204 and RF signal source 104. Detector circuit 106 includes diode D1, capacitors C1, C2, and resistors R1 and R2. Temperature compensating circuit 204 includes a voltage regulator 206, a switch module 208, and a resistive divider comprising resistors R3 and R4. Voltage regulator 206 includes Field Effect Transistors (FETs) Q3 and Q4, a Bi-Polar Junction Transistor (BJT) Q2, a diode D2, and resistors R6, R7 and R8. Switch module 208 includes a resistor R5 and a BJT Q1. Voltage regulator 206 supplies a regulated voltage, $V_{reg}$, which is temperature-dependent. Voltage regulator 206 is related to the voltage regulator as set forth in co-pending U.S. patent application Ser. No. 11/329,449, entitled "Compact Voltage Regulator", filed on Jan. 11, 2006, which is incorporated by reference herein.

A battery voltage, $V_{bat}$, is applied to the drain terminal of FET Q4. A control voltage, $V_{enable}$, is applied to the gate of FET Q4 through resistor R8. The source of FET Q4 is connected to the drain of FET Q3. Resistor R6 is connected between the gate and source of FET Q3. The anode of diode D2 is connected to the common node of resistor R6 and the source of FET Q3. The cathode of diode D2 is connected to the base of BJT Q2. The emitter of BJT Q2 is connected to ground through resistor R7. The collector of BJT Q2 is connected to the common node of resistor R6 and the gate of FET Q3.

RF signal source 104 is connected to the anode of diode D1 through capacitor C1. The cathode of diode D1 is connected to capacitor C2 and resistor R1. The other ends of capacitor C2 and resistor R1 are grounded. One end of resistor R2 is connected to the anode of diode D1 and the other end, to resistor R3 and resistor R4. The other end of resistor R4 is connected to the collector of BJT Q1. The emitter of BJT Q1 is grounded. The base of BJT Q1 is connected through resistor R5 to the control voltage, $V_{enable}$. Resistor R3 is connected to the common node of resistor R6, the source of FET Q3, and the anode of diode D2.

A temperature coefficient of voltage regulator 206 is based on the temperature coefficient of diode D2, and the base-emitter junction of BJT Q2. Resistive divider including resistors R3 and R4 is used to make the temperature co-efficient of temperature compensating circuit 204 equal to that of detector circuit 106. Switch module 208 is used to minimize leakage. When $V_{enable}$ is "low", voltage regulator 206 is "off". When voltage regulator 206 is "off", BJT Q1 is also "off". As a result, there is no leakage current flowing through BJT Q1. However, a small leakage current flows through diode D1. The leakage current flowing through diode D1 mainly depends on the magnitude of resistor R1.

In various embodiments of the invention, switch module 208 may include one or more transistors. In an embodiment of the invention, the one or more transistors may be Field Effect Transistors (FET). In another embodiment of the invention, the one or more transistors may be pseudomorphic High Electron Mobility Transistors (pHEMT).

Figure 3:
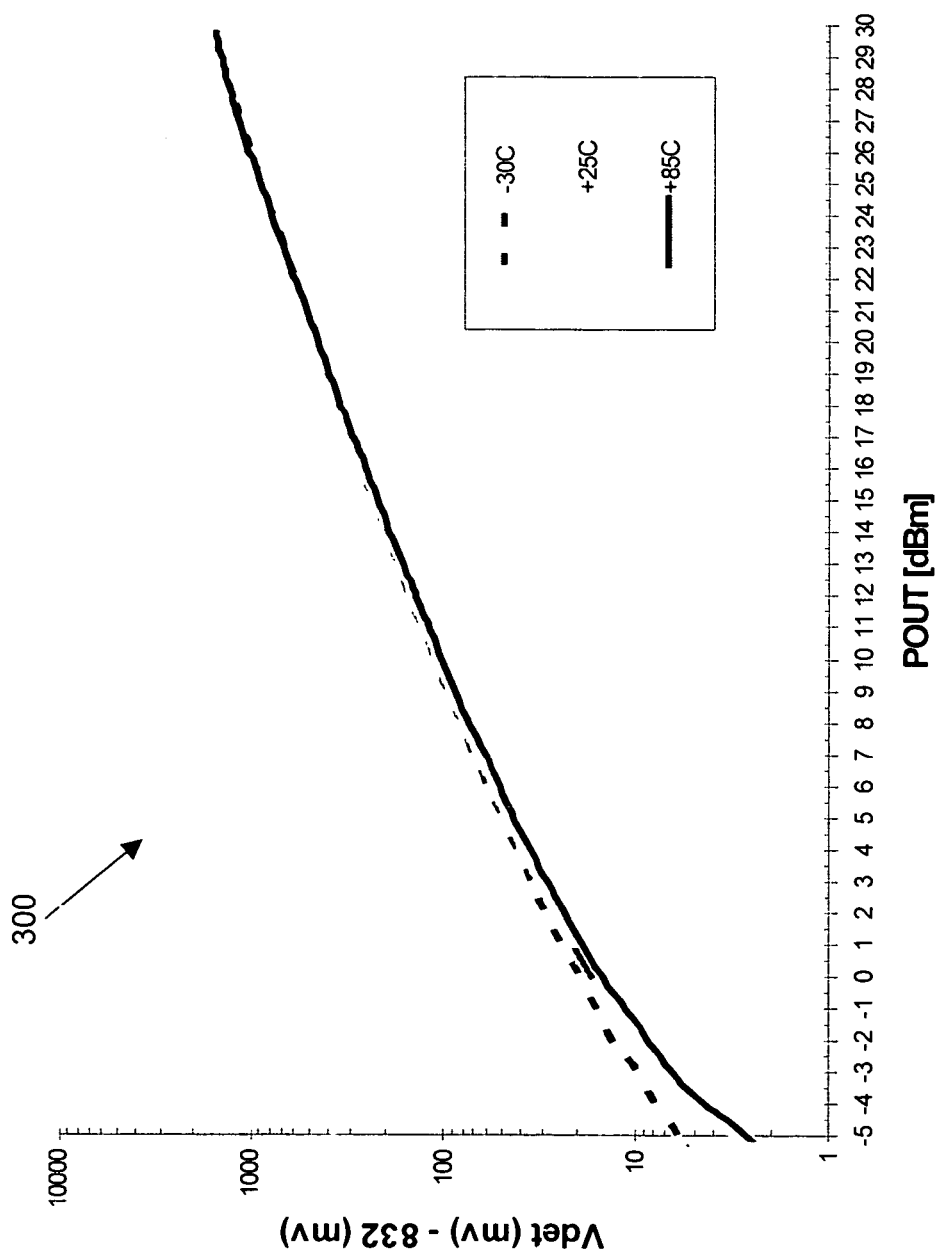
FIG. 3 is a graph depicting the temperature independence of a temperature-compensated power detector, in accordance an embodiment of the invention.

FIG. 3 is a graph 300 depicting the temperature independence of temperature-compensated power detector 102b, in accordance an embodiment of the invention. Graph 300 depicts the detector output voltage $V_{det}$ versus power at three different temperatures, −30° C., 25° C., and 85° C. The test frequency of the RF input signal was 837 MHz. The performance of power detector 102b is stable across a wide temperature and dynamic range. The performance is also invariant to battery voltage $V_{bat}$ (not shown in the figure).

The power detector, elaborated on above, has numerous advantages. The temperature-compensated power detector has a detection range that is greater than 30 dB. It is able to detect small variations in the power level, which are equivalent to variations of only a few milivolts. The output voltage of the temperature-compensated power detector is stable across a wide temperature range. Further, the temperature-compensated power detector is compact, consumes very little power, and occupies very little space when used with a compact voltage regulator.

While the foregoing is directed to embodiments of the present invention, other and further embodiments of the invention may be devised without departing from the basic scope thereof, and the scope thereof is determined by the claims that follow.

What is claimed is:

1. A temperature-compensated power detector, the temperature-compensated power detector comprising:
   a. a detector circuit, the detector circuit comprising at least one first diode, the at least one first diode detecting a power variation in an input RF signal from an RF signal source, the detector circuit having a first temperature coefficient; and
   b. a temperature compensating circuit, the temperature compensating circuit comprising:
      i. at least one voltage regulator, the at least one voltage regulator providing a regulated voltage with a second temperature coefficient; and
      ii. at least one resistive divider, the at least one resistive divider being coupled to the at least one voltage regulator, the at least one resistive divider dividing each of the regulated voltage and the second temperature coefficient in a pre-defined ratio to provide a biasing voltage with a third temperature coefficient to the at least one first diode, wherein the third temperature coefficient corresponding to the biasing voltage is equal to the first temperature coefficient;
   wherein the biasing current passing through the at least one first diode will remain constant.

2. The temperature-compensated power detector of claim 1, wherein the detector circuit further comprises a first capacitor, the first capacitor isolating the RF signal source from a DC voltage of the at least one first diode, wherein the RF signal source provides the input RF signal to the detector circuit.

3. The temperature-compensated power detector of claim 1, wherein the detector circuit further comprises one or more capacitors and one or more resistors, the one or more capacitors and the one or more resistors determining the discharging rate of the detector circuit.

4. The detector circuit of claim 1, wherein the at least one first diode is a diode connected Bipolar Junction Transistor (BJT).

5. The temperature compensating circuit of claim 1 further comprising a capacitor, the capacitor providing a path for AC components of the input RF signal to ground.

6. The temperature-compensated power detector of claim 1, wherein the at least one voltage regulator comprises at least one diode and at least one transistor, the at least one diode and the at least one transistor determining the second temperature coefficient of the at least one voltage regulator.

7. The at least one voltage regulator of claim 6, wherein the at least one diode is a diode connected Bipolar Junction Transistor (BJT).

8. The temperature-compensated power detector of claim 1, wherein the temperature compensating circuit further comprises a switch module, the switch module minimizing leakage current through the detector circuit when the at least one voltage regulator is not enabled.

9. The temperature-compensated power detector of claim 8, wherein the switch module comprises at least one transistor.

10. The temperature-compensated power detector of claim 9, wherein the at least one transistor is a Bipolar Junction Transistor (BJT).

11. The temperature-compensated power detector of claim 9, wherein the at least one transistor is a Field Effect Transistor (FET).

12. The temperature-compensated power detector of claim 9, wherein the at least one transistor is a pseudomorphic High Electron Mobility Transistor (pHEMT).

13. The temperature-compensated power detector of claim 1, wherein the at least one voltage regulator is enabled by means of a control voltage.

* * * * *